(12) United States Patent
Baillin (10) Patent No.: US 9,327,963 B2
(45) Date of Patent: May 3, 2016

(54) ENCAPSULATION STRUCTURE COMPRISING TRENCHES PARTIALLY FILLED WITH GETTER MATERIAL

(71) Applicant: COMMISSARIAT A L'ENERGIE ATOMIQUE ET AUX ENE ALT, Paris (FR)

(72) Inventor: Xavier Baillin, Crolles (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/555,913

(22) Filed: Nov. 28, 2014

(65) Prior Publication Data
US 2015/0151959 A1 Jun. 4, 2015

(30) Foreign Application Priority Data
Nov. 29, 2013 (FR) ...................... 13 61827

(51) Int. Cl.
*H01L 23/28* (2006.01)
*B81B 7/00* (2006.01)
(Continued)

(52) U.S. Cl.
CPC ........... *B81B 7/0038* (2013.01); *B81C 1/00285* (2013.01); *H01L 23/10* (2013.01); *H01L 23/26* (2013.01); *H01L 23/3121* (2013.01); *H01L 2924/0002* (2013.01)

(58) Field of Classification Search
CPC . H01L 23/315; H01L 31/0203; H01L 31/048; H01L 51/5237; H01L 23/3107; H01L 23/3121; H01L 23/10; H01L 23/26; H01L 23/3123; B81B 7/0038; B81C 1/00285
USPC ....................................................... 257/787
See application file for complete search history.

(56) References Cited

U.S. PATENT DOCUMENTS

| 5,921,461 A | 7/1999 | Kennedy et al. |
|---|---|---|
| 6,252,294 B1 | 6/2001 | Hattori et al. |

(Continued)

FOREIGN PATENT DOCUMENTS

| DE | 10 2008 060 796 A1 | 5/2010 |
|---|---|---|
| EP | 1 585 371 A2 | 10/2005 |

(Continued)

OTHER PUBLICATIONS

French Preliminary Search Report issued Aug. 26, 2014, in French Application No. 13 61827 filed Nov. 29, 2013 (with English Translation).

(Continued)

*Primary Examiner* — Hung Vu
(74) *Attorney, Agent, or Firm* — Oblon, McClelland, Maier & Neustadt, L.L.P (57) ABSTRACT

An encapsulation structure comprising at least:
a hermetically sealed cavity in which a micro-device is encapsulated,
a substrate of which one face delimits one side of the cavity,
at least two trenches formed through said face of the substrate, the interior volumes of each of the trenches communicating together,
first portions of getter material covering at least in part side walls of the trenches without entirely filling the trenches, and completely covering the trenches at said face of the substrate,
an opening formed through one of the first portions of getter material or through the substrate and making the interior volumes of the trenches communicate with an interior volume of the cavity.

13 Claims, 6 Drawing Sheets

(51) Int. Cl.
*B81C 1/00* (2006.01)
*H01L 23/10* (2006.01)
*H01L 23/26* (2006.01)
*H01L 23/31* (2006.01)

(56) References Cited

U.S. PATENT DOCUMENTS

| | | | |
|---|---|---|---|
| 7,160,368 | B1 | 1/2007 | Wakelin |
| 7,508,064 | B2 * | 3/2009 | Martin ............... B81B 7/0051 257/704 |
| 7,709,940 | B2 * | 5/2010 | Pan ................... B81C 1/00293 257/678 |
| 8,884,331 | B2 | 11/2014 | Baillin et al. |
| 8,962,069 | B2 | 2/2015 | Pornin et al. |
| 2002/0070421 | A1 | 6/2002 | Ashburn et al. |
| 2004/0207071 | A1 * | 10/2004 | Shiomi ............... B32B 15/018 257/704 |
| 2010/0001361 | A1 | 1/2010 | Caplet et al. |
| 2010/0003789 | A1 | 1/2010 | Caplet et al. |
| 2010/0178419 | A1 | 7/2010 | Baillin |
| 2011/0079425 | A1 | 4/2011 | Baillin et al. |
| 2012/0052313 | A1 | 3/2012 | Sibuet et al. |
| 2012/0325091 | A1 | 12/2012 | Caplet |
| 2012/0328779 | A1 | 12/2012 | Caplet et al. |
| 2013/0089955 | A1 | 4/2013 | Baillin et al. |
| 2013/0207281 | A1 | 8/2013 | Baillin et al. |
| 2014/0038364 | A1 | 2/2014 | Nicolas |
| 2015/0028433 | A1 | 1/2015 | Baillin et al. |

FOREIGN PATENT DOCUMENTS

| | | |
|---|---|---|
| EP | 2 450 949 A1 | 5/2012 |
| FR | 2 922 202 A1 | 4/2009 |
| FR | 2 950 876 A1 | 4/2011 |
| FR | 2 976 932 A1 | 12/2012 |
| FR | 2 976 933 A1 | 12/2012 |
| FR | 2 981 059 A1 | 4/2013 |
| FR | 2 981 198 A1 | 4/2013 |

OTHER PUBLICATIONS

U.S. Appl. No. 14/857,047, filed Sep. 17, 2015, Baillin.
U.S. Appl. No. 14/725,028, filed May 29, 2015, Baillin.

* cited by examiner

ENCAPSULATION STRUCTURE COMPRISING TRENCHES PARTIALLY FILLED WITH GETTER MATERIAL

TECHNICAL FIELD

The invention relates to an encapsulation structure comprising a hermetically sealed cavity in which are encapsulated at least one micro-device, also called microsystem or micro-component, for example of MEMS (micro-electro-mechanical system), NEMS (nano-electro-mechanical system), MOEMS (micro-opto-electro-mechanical system), NOEMS (nano-opto-electro-mechanical system) type, or of infrared micro-detector type, or more generally any device intended to be encapsulated under controlled atmosphere, optionally with one or more electronic components, forming for example an integrated circuit, and a getter material.

The invention also relates to a method of encapsulating at least one micro-device making it possible to form such an encapsulation structure.

PRIOR ART

Some micro-devices, such as those of MEMS, NEMS, MOEMS type or infrared micro-detectors, require for their correct operation to be sealed, or encapsulated, in a hermetic manner in a cavity in which the atmosphere is controlled (control of the nature of the gas or gases and the pressure in the cavity).

Such an encapsulation may be carried out in a collective manner for several micro-devices formed on a same substrate (or wafer), called first substrate. Each of the micro-devices is then encapsulated in a cavity formed by transfer and hermetic sealing of a cover, for example formed by a second substrate of silicon or glass, on the first substrate. This hermetic assembly between the first substrate and the second substrate, called "wafer-to-wafer" (W2W) and forming in a collective manner the encapsulation cavities of the micro-devices, makes it possible to protect the atmosphere in the cavities while preventing leaks of gas between the interior of the cavities and the exterior environment. In a variant, the cavities may be formed by an encapsulation of TFP (Thin Film Packaging) type, the covers being in this case formed of one or more superimposed thin films and formed on the first substrate via the use of a sacrificial material on which the thin film(s) are deposited.

The addition of non-evaporable getters (NEG) into the cavities, for example in the form of solid portions of getter material arranged in these cavities, makes it possible to control the characteristics of the atmosphere within the cavities via a gaseous pumping carried out by these getters. The portions of getter material may be formed from a thin film deposition of the getter material carried out on one or the other of the two substrates, prior to the W2W assembly operation between the two substrates, or from a deposition on the first substrate in the case of a TFP type encapsulation. A shaping of the portions of getter material in the plane of the surface of the substrate on which the getter material is deposited is then carried out by implementation of technological operations of photolithography and etching of the thin film of getter material. In the case of a TFP type encapsulation, the getter material may be produced in the form of a thin film corresponding to the first layer of the stack of thin films of the cover, thereby forming the interior wall of the cover delimiting the cavity.

In a variant, it is possible to deposit the getter material discretely, directly in the desired form. To do so, the getter material may be deposited directly on one or the other of the two substrates either through a template, or by lift-off through a film of photosensitive resin shaped beforehand by photolithography, this film of resin being removed after the deposition of the getter material through it.

In general, during a W2W type assembly, the getter deposited is monolithic, of square or rectangular shape and only the face opposite to that in contact with the substrate on which the getter is deposited is in contact with the atmosphere of the cavity. The getter may be deposited on the substrate which hosts the device, that is to say the first substrate, or on the second substrate serving as cover. In the case of a TFP type encapsulation, the getter may be deposited either in an identical manner to the preceding case, that is to say on the first substrate, or on the sacrificial layer which makes it possible to construct the cover in thin films. In all cases, only the face opposite to that in contact with the host substrate or the thin films of the cover is able to carry out a gaseous absorption and/or adsorption. Furthermore, in such a configuration, the surface area necessary for the formation of the portion of getter material is important.

The document U.S. Pat. No. 5,921,461 describes an encapsulation structure in which luminous sensors are encapsulated in a cavity defined between a base and a cover assembled together after the deposition of the getter. The getter is deposited on the base, in a zone not comprising the sensors and not located opposite transparent windows formed in the cover. The getter may in particular be formed in the form of a grid, which makes it possible to form the sensors between the portions of getter material forming the grid. Although such a configuration makes it possible to position precisely the portions of getter material on the base without perturbing the operation of the sensors, and thereby reduce the constraints linked to the surface area necessary for the formation of the getter material compared to a monolithic portion of getter material, the surface area of getter material thereby obtained may in some cases prove to be insufficient, such as for example to reach a high vacuum of the order of $10^{-4}$ to $10^{-3}$ mbar within the cavity.

In order to increase the surface area of getter material exposed in the cavity, the document FR 2 976 933 describes an encapsulation structure comprising a getter material deposited on a material permeable to gas. Thus, the face of the getter material in contact with the material permeable to the gases is accessible and able to carry out a gaseous adsorption and/or absorption, in addition to the other faces of the getter material. Although such a structure makes it possible to obtain an enhanced gaseous pumping capacity for a given portion of getter material, this structure is not suitable when the surface area available for the formation of the getter is reduced and/or irregular given the monolithic structure of the portion of getter material formed.

DESCRIPTION OF THE INVENTION

Thus there is a need to propose an encapsulation structure making it possible to have both an important surface area of getter material exposed in the cavity of the encapsulation structure while only requiring a reduced occupation surface area in the cavity for the formation of the getter material and/or which is compatible with an irregular host surface.

To do so, an encapsulation structure is proposed comprising at least:
 a hermetically sealed cavity in which a micro-device is encapsulated,
 a substrate of which one face delimits one side of the cavity, one or more trenches formed through said face of the substrate, first portions of getter material covering at least in part the side walls of the trench or of the trenches.

An encapsulation structure is moreover proposed comprising at least:
- a hermetically sealed cavity in which a micro-device is encapsulated,
- a substrate of which one face delimits one side of the cavity,
- at least two trenches formed through said face of the substrate, the interior volumes of each of the trenches communicating together,
- first portions of getter material covering at least in part the side walls of the trenches.

The formation of portions of getter material within trenches formed in the substrate (this substrate being able to correspond to a first substrate on which the micro-device is formed and/or to a second substrate forming the cover of the cavity in the case of a W2W assembly between the first substrate and the second substrate) thus makes it possible to respond to the need of a getter having a small size as regards the occupation surface area on the substrate thanks to the use of the surfaces of the side walls of the trenches on which are arranged the portions of getter material. Thus, for a given surface area of the substrate corresponding to the surface area occupied by the trenches, the surface area of the first portions of getter material arranged on the side walls of these trenches may be greater than the surface area of the substrate occupied by these trenches. Moreover, for a given occupation surface area on the substrate, the pumping capacity of the getter material obtained with such an encapsulation structure may be greater than that which would be obtained with a portion of getter material deposited directly on this occupation surface area without trench.

The formation of the first portions of getter material at least on the side walls of the trenches moreover makes it possible to form these first portions of getter material on irregular host surfaces because these first portions of getter material do not require having, at the substrate, a large, flat and regular surface. Indeed, the fact that the trenches are spread out in a regular manner or not in the substrate does not affect the gaseous pumping capacity of the portions of getter material formed on the side walls of these trenches.

The use of the side walls of the trenches to arrange thereon portions of getter material makes it possible to localise judiciously the getter material in zones that may be narrow so as not to perturb the operation of the encapsulated micro-device(s).

Furthermore, with such an encapsulation structure, except for the trenches, it is not necessary to structure the substrate at which the portions of getter material are formed, which facilitates the implementation of subsequent technological operations on this substrate.

The geometry of the trenches formed is also easily adjustable as a function of the gaseous absorption and/or adsorption needs in the encapsulation structure, and thus as a function of the deposition surface area necessary for the portions of getter material to carry out this gaseous absorption and/or this adsorption.

Finally, such an encapsulation structure is compatible with a W2W type assembly, that is to say via the assembly of two substrates together, or with a TFP type encapsulation.

The encapsulation structure moreover makes it possible to reach a high vacuum of the order of $10^{-4}$ to $10^{-3}$ mbar within the cavity.

Due to the fact that the interior volumes of each of the trenches communicate together, it is possible to have access to these interior volumes via for example a single opening forming a direct access to the interior volume of one of the trenches.

One embodiment proposes an encapsulation structure comprising at least:
- a hermetically sealed cavity in which a micro-device is encapsulated,
- a substrate of which one face delimits one side of the cavity,
- at least two trenches formed through said face of the substrate, the interior volumes of each of the trenches communicating together,
- first portions of getter material covering at least in part the side walls of the trenches without entirely filling the trenches, and completely covering the trenches at said face of the substrate,
- an opening formed through one of the first portions of getter material or through the substrate and making the interior volumes of the trenches communicate with an interior volume of the cavity.

The first portions of getter material only partially fill the trenches, a part of the volume of the trenches not being occupied by the getter material.

The trenches may be formed in the substrate according to a grid pattern such that each of the trenches intersects at least one other trench.

The encapsulation structure may further comprise one or more second portions of getter material arranged at one or more bottom wall(s) of the trenches. This configuration makes it possible to take advantage also of the bottom wall(s) of one or more of the trenches, and thus to have, for a same occupation surface area on the substrate, a greater surface area of getter material making it possible to carry out an absorption and/or an adsorption of gas.

The getter materials of the first and/or second portions of getter material may be chosen for example from zirconium and/or titanium and/or another metal material having gaseous absorption and/or adsorption properties and/or by a combination of these materials.

The first portions of getter material may cover partially at least one of the trenches at said face of the substrate. Thus, the surfaces of the first portions of getter material, and potentially the surfaces of one or more second portions of getter material when such second portions of getter material are formed at the bottom walls of one or more of the trenches, making it possible to perform a pumping of gas may be directly accessible from one or more free spaces located between the first portions of getter material arranged on the side walls of a trench.

In a variant, the first portions of getter material may completely cover the trenches at said face of the substrate, and at least one opening may be formed through one of the first portions of getter material or through the substrate to make the interior volumes of the trenches communicate with an interior volume of the cavity. In this case, the surfaces of the first portions of getter material making it possible to perform a pumping of gas may be accessible from this opening. Furthermore, due to the fact that the interior volumes of each of the trenches communicate together, a single opening may for example make it possible to place in contact the first portions of getter material with the atmosphere in the cavity via this opening.

In this case, the opening may be plugged with a plugging material. Such a plugging material, corresponding for example to a fusible material, may serve to place in communication the interior volumes of the trenches with the atmosphere of the cavity subsequent to the encapsulation of the micro-device, while freeing the opening of this plugging material (for example by making the fusible material melt)

subsequent to the encapsulation. This can make it possible for example to free a volume of vacuum (or a particular pressure) or particular gas stored in the interior volumes of the trenches at a desired time, for example to re-establish a defined level of vacuum or a particular gas pressure during the lifetime of the micro-device, or instead to activate the pumping function of the portions of getter material at the desired time, subsequent to the formation of the encapsulation structure. It is in particular possible to free a noble gas such as argon or krypton stored in the interior volumes of the trenches. In this case, the getter material may serve to pump gases other than the noble gases present in the cavity, to end up with a controlled atmosphere of noble gas. Such a configuration is advantageous when a resonating micro-device operating under a partial pressure of gas is encapsulated in the cavity.

The first portions of getter material may cover the parts of said face of the substrate located around the trenches. It is thus possible to use the parts of the surface of the substrate to increase the surface area of getter material exposed to the atmosphere of the cavity.

The first portions of getter material may comprise columnar grains oriented along a direction forming a non-zero angle and less than 90° with the side walls of the trenches. Such an arrangement of columnar grains of the getter material of the first portions makes it possible to increase the gaseous absorption and/or adsorption capacity of the first portions of getter material.

The dimensions of at least one of the trenches, at said face of the substrate, may be less than the dimensions of said at least one of the trenches at a bottom wall of said at least one of the trenches. Such a configuration may advantageously be used when at least one of the trenches further serves as reserve of vacuum or gas intended to be freed subsequent to the formation of the encapsulation structure because with such dimensions, a greater volume of vacuum or gas may be stored in this or these trenches. The section of said at least one of the trenches, in a plane perpendicular to said face of the substrate, may be of trapezoidal type.

At least one part of at least one of the trenches may comprise several secondary trenches formed through said face of the substrate, arranged next to each other and in which the interior volumes communicate together, the first portions of getter material being able to cover at least in part the side walls of the secondary trenches. Such secondary trenches may for example serve to increase the surface area of getter material formed by using as best as possible the free surfaces of the substrate, these secondary trenches being for example formed at regions of the substrate having a free surface area greater than that of the other regions of the substrate where the remainder of the trench or trenches not comprising secondary trenches is formed.

The first portions of getter material may be formed of at least one first layer of a first getter material and at least one second layer of a second getter material.

The second getter material may be different from the first getter material. Thus, it is possible to obtain different gaseous absorption and/or adsorption properties in the cavity (vis-à-vis the nature of the gases to trap and/or the thermal activation temperature for example).

The first layer of the first getter material may completely cover the trenches at said face of the substrate, and the second layer of the second getter material may cover the first layer of the first getter material.

In a variant, the first layer of the first getter material may cover partially the trenches at said face of the substrate, and the second layer of the second getter material may cover the first layer of the first getter material and completely seal the trenches at said face of the substrate.

A method of encapsulation of at least one micro-device is also proposed, comprising at least the implementation of the steps of:
  forming at least two trenches through one face of a substrate such that the interior volumes of each of the trenches communicate together;
  forming first portions of getter material covering at least in part side walls of the trenches;
  hermetic sealing of a cavity in which the micro-device is arranged and such that said face of the substrate delimits one side of the cavity.

Such a method of encapsulation may advantageously be implemented to carry out a collective encapsulation of several micro-devices in different cavities to produce a packaging of these micro-devices under controlled atmosphere.

Another embodiment also relates to a method of encapsulation of at least one micro-device, comprising at least the implementation of the steps of:
  forming at least two trenches through one face of a substrate such that the interior volumes of each of the trenches communicate together;
  forming first portions of getter material covering at least in part side walls of the trenches without entirely filling the trenches, and completely covering the trenches at said face of the substrate;
  forming at least one opening through one of the first portions of getter material or through the substrate and making the interior volumes of the trenches communicate with an interior volume of a cavity in which the micro-device is arranged and such that said face of the substrate delimits one side of the cavity;
  hermetic sealing of the cavity.

BRIEF DESCRIPTION OF THE DRAWINGS

The present invention will be better understood on reading the description of examples of embodiment given for purely indicative purposes and in no way limiting and by referring to the appended drawings in which.

Identical, similar or equivalent parts of the different figures described hereafter bear the same numerical references so as to make it easier to go from one figure to the next.

The different parts shown in the figures are not necessarily shown to a uniform scale in order to make the figures more legible.

The different possibilities (variants and embodiments) must be understood as not being mutually exclusive and may be combined together.

DETAILED DESCRIPTION OF PARTICULAR EMBODIMENTS

Figure 1:
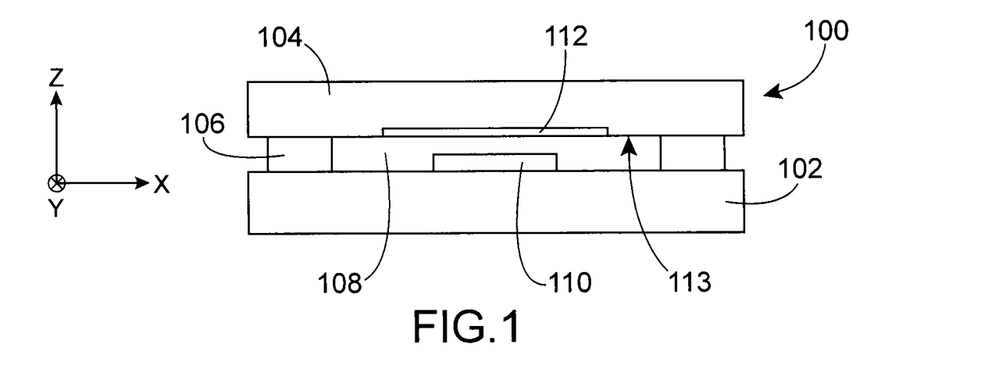
FIGS. 1 to 3 show schematically encapsulation structures according to different embodiments.

Reference will firstly be made to FIG. 1 which shows schematically an encapsulation structure 100 according to a first embodiment.

This encapsulation structure 100 is of W2W type, that is to say is formed by the assembly of a first substrate 102 with a second substrate 104 forming the cover of the encapsulation structure 100, for example both comprising a semiconductor such as silicon, these two substrates 102 and 104 being assembled to each other via a sealing bead 106. A cavity 108 is formed by the space obtained between the first substrate 102 and the second substrate 104, the sealing bead 106 forming the side walls of the cavity 108. A micro-device 110, for example of MEMS, NEMS, MOEMS, NOEMS type or infrared detector such as a micro-bolometer, is encapsulated in the cavity 108. Furthermore, a getter material 112, for example zirconium and/or titanium or any other metal material having gaseous absorption and/or adsorption properties, is also present in the cavity 108, at a wall of the cover formed by a face 113 of the second substrate 104, this face 113 forming an interior wall of the cavity 108.

Figure 2:
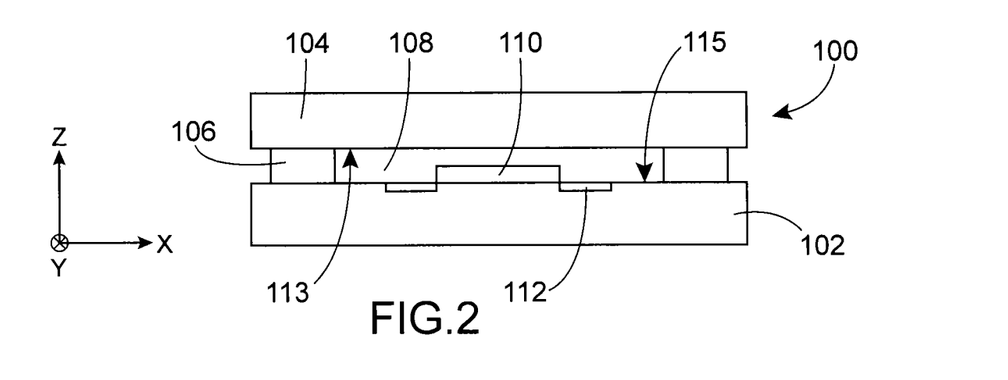

FIG. 2 shows schematically the encapsulation structure 100 according to a variant of the first embodiment. In this embodiment variant, the getter material 112 is formed not on the face 113 of the second substrate 104, but on a face 115 of the first substrate 102 at which is also located the micro-device 110 and also forming an interior wall of the cavity 108. The getter material 112 is here formed at the periphery of the micro-device 110.

According to another variant of the first embodiment, the encapsulation structure may comprise getter material both on the face 113 of the second substrate 104 and on the face 115 of the first substrate 102.

Figure 3:
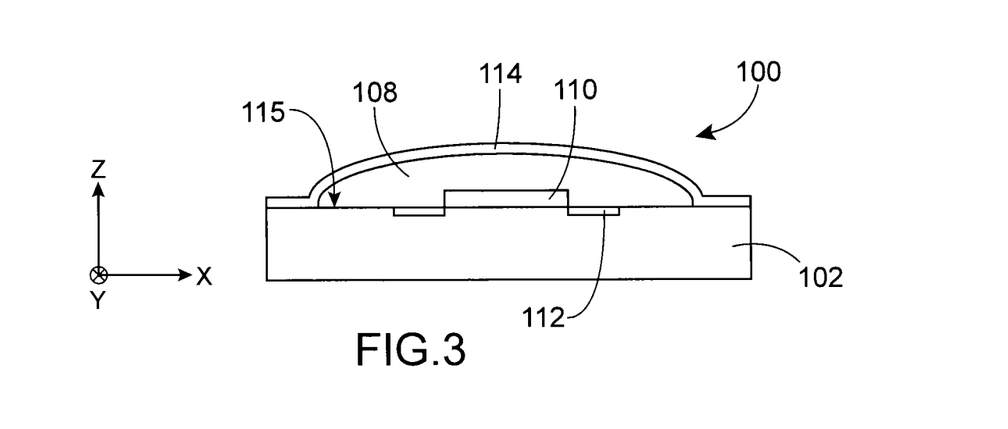

FIG. 3 shows schematically the encapsulation structure 100 according to a second embodiment. In this second embodiment, the encapsulation structure 100 is not of W2W type, but of TFP type that is to say comprises a cover 114 formed of one or more thin films. As in the variant described with reference to FIG. 2, the getter material 112 is formed on the face 115 of the first substrate 102 on which is also located the micro-device 110.

Details will now be described, with reference to FIGS. 4 to 18, of an embodiment of the getter material 112 in the encapsulation structure 100. In fact, in all of the embodiments or variants of embodiment of the encapsulation structure 100, the getter material 112 is formed at least in part in the trenches, or channels, formed through the face of the substrate at which is located the getter material 112, that is to say through the face 113 of the second substrate 104 and/or the face 115 of the first substrate 102. In the examples of FIGS. 4 to 18, the trenches are formed through the face 115 of the first substrate 102, around the micro-device 110. The characteristics described below with reference to FIGS. 4 to 18 also apply when the getter material 112 is formed in the trenches formed through the face 113 of the second substrate 104.

Figure 4:
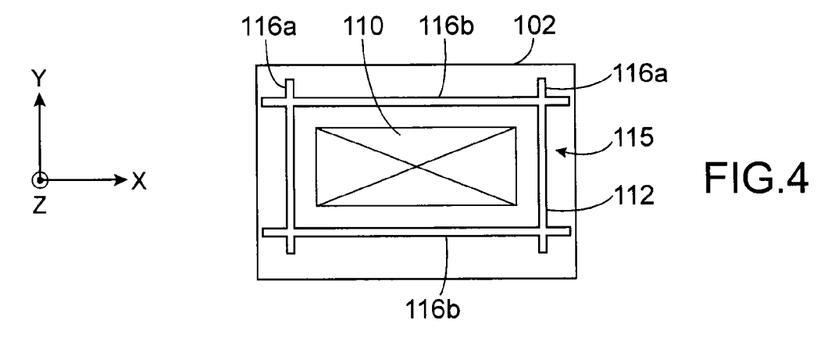
FIGS. 4 to 18 show schematically examples of embodiment of trenches of encapsulation structures in which portions of getter material are formed.

FIG. 4 is a top view of part of the first substrate 102 of the encapsulation structure 100 described previously with reference to FIG. 2 or FIG. 3. The getter material is produced in the form of portions of getter material 112 covering at least in part (part of the height) the side walls of the trenches 116 (the portions of getter material 112 are deposited on the upper parts of the side walls of the trenches 116) formed through the face 115 of the first substrate 102, in part of the thickness of the first substrate 102. These trenches 116 are produced in the form of a network which corresponds here, in a plane parallel to the face 115 of the first substrate 102 (plane (X,Y) in FIG. 4), to a grid pattern. In the example of FIG. 4, this grid pattern is formed by the vertical trenches 116a, parallel to the Y axis, perpendicularly intersecting the horizontal trenches 116b parallel to the X axis.

In a variant, the trenches 116 may intersect while forming a different pattern, for example a gridding of any shape, polygonal or not. It is also possible to form the trenches 116 such that they do not intersect, or instead to form a single trench 116 for example formed around the micro-device 110.

Figure 5:
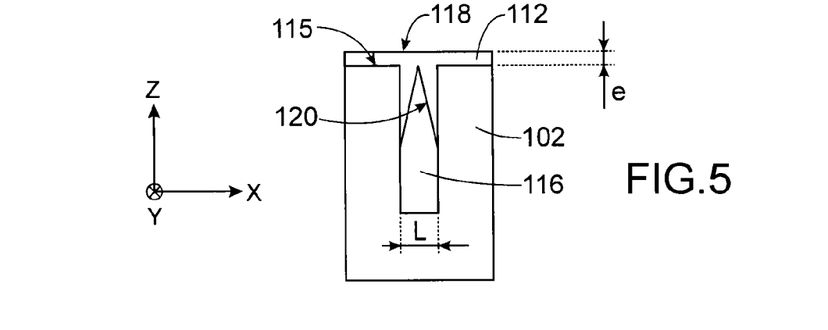

FIG. 5 shows a profile view of a first example of embodiment of the trenches 116, here corresponding to one of the vertical trenches 116a. The dimension along the X axis of the trench 116 shown in FIG. 5 corresponds to the width L of this trench 116. The portions of getter material 112 are deposited on part of the side walls of the trench 116. These side walls of the trench 116 are substantially perpendicular to the face 115 of the first substrate 102. In this first embodiment example, the portions of getter material 112 deposited on the side walls of the trench 116 join together at the face 115 and thereby completely cover the trench 116 in which the portions of getter material 112 are formed. The interior of the trench 116 is not accessible from the parts of the trench 116 that are completely covered by the portions of getter material 112. The portions of getter material 112 also cover parts of the face 115 of the first substrate 102 located around the trench 116.

Figure 17:
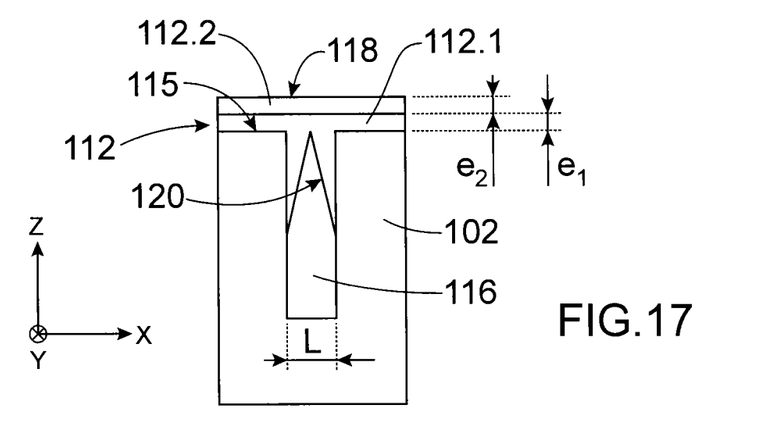

FIG. 17 shows a profile view of a variant of the first example of embodiment of the trenches 116 described previously with reference to FIG. 5. In this variant, the portions of getter material 112 are formed by a first layer 112.1 of a first getter material of thickness $e_1$ and a second layer 112.2 of a second getter material of thickness $e_2$. The first layer 112.1 forms the parts of getter material deposited on the side walls of the trench 116, these parts coming together at the face 115 in order to completely cover the trench 116 at the face 115 of the substrate 102. The first and second getter materials of the layers 112.1 and 112.2 are advantageously different to each other. The second layer 112.2 is exposed directly in the cavity 108 of the encapsulation structure 100, whereas the first layer 112.1 is exposed in the trench 116. Such a variant makes it possible in particular to have in the cavity 108 two getter materials having different gaseous absorption and/or adsorption properties (vis-à-vis the nature of the gases to be trapped and/or the thermal activation temperature for example). The first layer 112.1 comprises for example titanium and the second layer 112.2 comprises for example zirconium (zirconium having a thermal activation temperature less than that of titanium).

Figure 18:
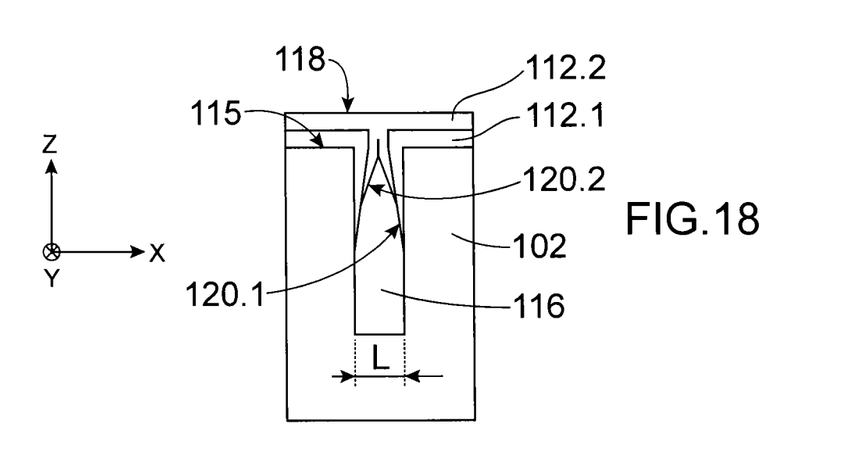

FIG. 18 shows a profile view of another variant of the first example of embodiment of the trenches 116 described previously with reference to FIG. 5. In this variant, the first layer 112.1 of the first getter material only partially covers the trench 116 at the face 115 of the substrate 102. The second layer 112.2 of the second getter material covers the first layer 112.1 and completely seals the trench 116 at the face 115 of the substrate 102. Such a variant is advantageous because it makes it possible to "pre-plug" the upper part of the trench 116 with the deposition of the first getter material which covers at least in part the side walls of the trench 116, the second getter material making it possible to completely seal the trench 116 and to cover it. This variant makes it possible to increase the width L of the trench 116 up to a value equal to around two times the thickness of the second layer 112.2 and thus also to increase the depth of the trench 116, for example up to a value equal to around sixty times the thickness of the second layer 112.2 when the aspect ratio of the trench is equal to around 30.

A deposition of portions of getter material 112 along the side walls of the trenches 116 makes it possible to obtain a getter material having columnar grains oriented along a direction forming a non-zero angle with the side walls of the trenches. Such an arrangement of columnar grains of the getter material makes it possible to increase the gaseous absorption and/or adsorption capacity of the first portions of getter material compared to a getter material deposited in a conventional manner in the form of a monolithic portion on the substrate.

Access to the interior of the trench 116, in order to make the interior of the trench 116 communicate with the cavity 108, is obtained for example via at least one part of at least one of the trenches 116 which is not covered by portions of getter material 112 (not visible in FIG. 4). This access to the interior of the trench 116 may be obtained from the deposition of portions of getter material 112 by not depositing the getter material on this part of at least one of the trenches 116, for example via a "lift-off" type method with a dry film, or instead subsequent to the deposition of the getter material by forming an opening through one of the portions of getter material 112. Due to the fact that the trenches 116 formed in the first substrate 102 intersect, the interior volumes of the trenches 116 communicate together. Access to the interior of one of the trenches 116 thus makes it possible to make the interior volumes of all the trenches 116 communicate with the atmosphere of the cavity 108. Access to the interior of the trench 116 may also be obtained via an opening formed through one of the portions of getter material 112 or through the substrate 102.

Thus, in the encapsulation structure 100 comprising such trenches 116 in which the side walls are covered at least in part by the portions of getter material 112 and in which the interior volumes communicate with the cavity 108, a gaseous absorption and/or adsorption is carried out in the cavity 108 both by a first exterior surface 118 of the portions of getter material 112 which is directly exposed in the cavity 108 at the face 115 of the first substrate 102, but also by a second surface 120 of the portions of getter material 112 located inside the trenches 116, at side walls of the trenches 116 and exposed to the atmosphere of the cavity 108 via the access described previously, thereby forming a large surface area of getter material exposed to the atmosphere of the cavity 108 while minimising the surface area occupied by the getter material at the face 115 of the first substrate 102. In the example of FIG. 17, the first exterior surface 118 corresponds to the upper surface of the second layer 112.2 and the second surface 120 located inside the trenches 116 corresponds to a surface formed by the first layer 112.1. In the example of FIG. 18, the first exterior surface 118 corresponds to the upper surface of the second layer 112.2. The layers 112.1 and 112.2 each have part of their surface, respectively referenced 120.1 and 120.2, exposed in the trenches 116.

Figure 6:
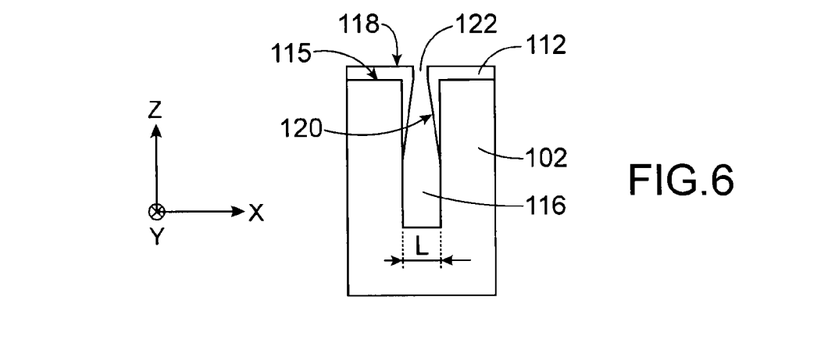

FIG. 6 shows a profile view of a second example of embodiment of the trenches 116, here corresponding to one of the vertical trenches 116a. In this second embodiment example, the portions of getter material 112 do not completely cover the trenches 116 on which the portions of getter material 112 are formed. Thus, the interior of the trenches 116 is accessible from a space 122 formed between the portions of getter material 112 over the whole length of the trenches 116. The portions of getter material 112 also cover parts of the face 115 of the first substrate 102 located around the trenches 116. Furthermore, portions of getter material 112 are also deposited on part of the interior side walls of the trenches 116, and more precisely on the upper parts of these side walls. In this second embodiment example, thanks to the spaces 122 formed between the portions of getter material 112, the surfaces 118 and 120 of the portions of getter material 112 are directly exposed to the atmosphere of the cavity 108 without it being necessary to form an opening later through one or more of the portions of getter material 112.

Figure 7:
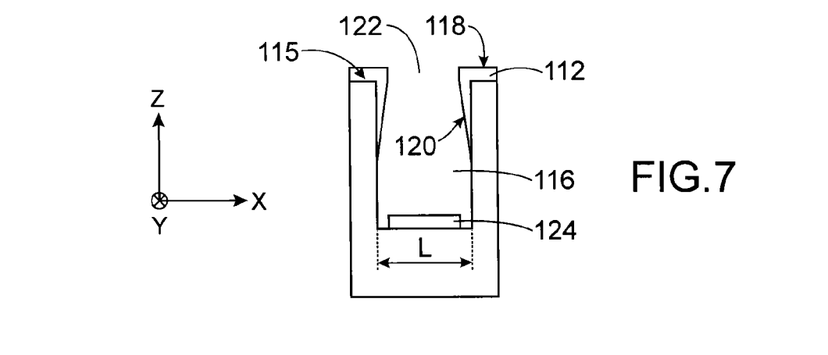

FIG. 7 shows a profile view of a third example of embodiment of the trenches 116, here corresponding to one of the vertical trenches 116a. Compared to the second embodiment example described previously with reference to FIG. 6, second portions of getter material 124 are arranged at the bottom walls of the trenches 116, which makes it possible to further increase the surface areas of getter material exposed to the atmosphere of the cavity 108.

In the three embodiment examples described previously with reference to FIGS. 5 to 7 as well as in the variants of FIGS. 17 and 18, the portions of getter material 112 are formed by deposition above the trenches 116. Thus, the fact that the portions of getter material 112 deposited correspond to one or the other of these three embodiment examples depends in particular on the width L with which the trenches 116 are formed as well as the thickness e of the portions of getter material 112 deposited. In these three examples, the width L of the trench 116 shown in FIG. 5 is less than that of the trench 116 shown in FIG. 6 which itself is less than that of the trench 116 shown in FIG. 7. In the first example shown in FIG. 5, the width L of the trenches 116 is for example equal to around 2 times the thickness e of the portions of getter material 112 (or around 2 times the thickness $e_1$ of the first layer 112.1 in the case of FIG. 17), this thickness e being for example greater than or equal to around 100 nm, and preferably between around 100 nm and 2 µm. In the second example shown in FIG. 6 and the third example shown in FIG. 7, the width L of the trenches 116 is for example greater than around 2 times the thickness e of the portions of getter material 112 (or greater than around 2 times the thickness of the first layer 112.1 in the case of FIG. 18). In these three embodiment examples, the aspect ratio of the trenches 116, corresponding to the depth/width ratio of the trenches 116, may be equal to around 30 and for example between around 15 and 25.

Figure 8:
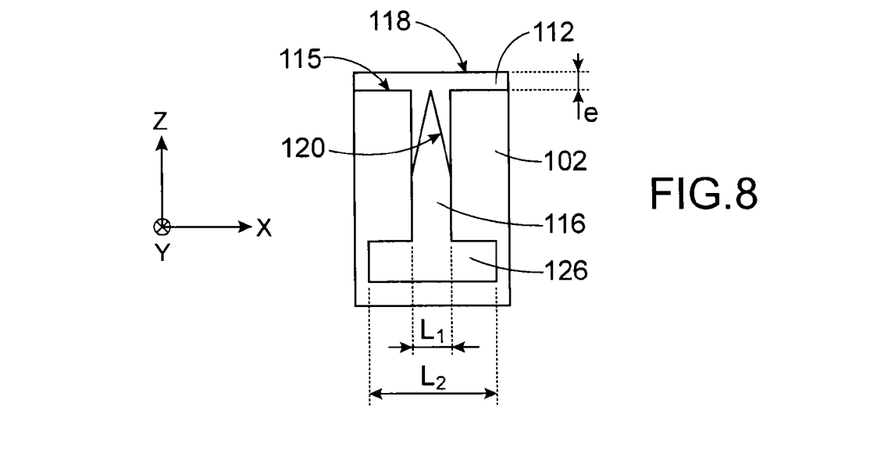

FIG. 8 shows a profile view of a fourth example of embodiment of a trench 116, corresponding here to one of the vertical trenches 116a. As for the first example described previously with reference to FIG. 5, the thickness e of the portions of getter material 112 and the width L1 of the trenches 116 are chosen such that the portions of getter material 112 completely cover the trenches 116 on which the portions of getter material 112 are formed. One or more of the trenches 116, or each of the trenches 116, comprises a lower part 126 of width L2 greater than the width L1 of the rest of the trench 116. The dimensions of the trench 116, at the face 115 of the first substrate 102, are thus less than the dimensions of the trench 116 at a bottom wall of the trench 116, that is to say at the lower part 126.

Thus, if the portions of getter material 112 are deposited under a particular atmosphere, for example under vacuum, and if access to the interior volumes of the trenches 116 is only achieved after the hermetic encapsulation of the microdevice 110, via the formation of an opening as described previously, the lower parts 126 of the trenches 116 then form reserves of this particular atmosphere of which the contents are added to the atmosphere of the cavity 108 after sealing during the formation of the opening, for example vacuum reserves that are added later to the vacuum with which the cavity 108 is hermetically sealed. Such trenches 116 are for example formed from a SOI (semiconductor on insulator) substrate, the trenches 116 being formed firstly through the whole thickness of the upper layer of semiconductor of the SOI substrate, the lower parts 126 then being formed by etching of the buried insulating layer of the SOI substrate. Such trenches 116, that is to say comprising lower parts 126 of width greater than the rest of the trenches 116, may also serve for depositions of portions of getter material 112 similar to those described previously with reference to FIGS. 6 and 7.

Figure 9:
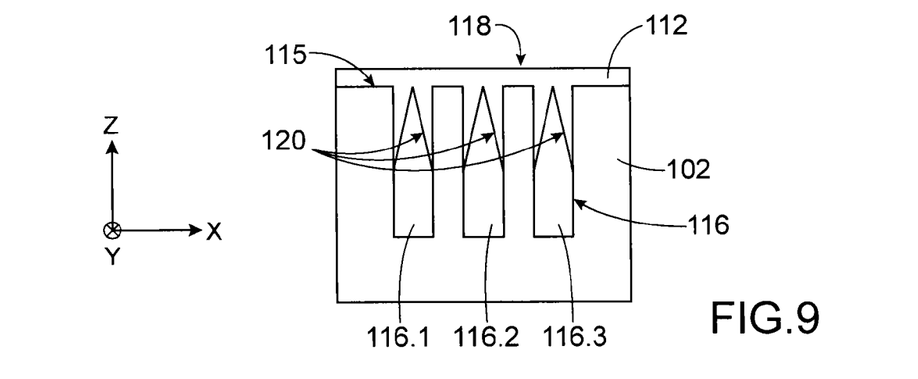

FIG. 9 shows a profile view of a fifth example of embodiment of the trenches 116, here corresponding to one of the vertical trenches 116a. The trench 116 is formed of several secondary trenches formed substantially parallel to each other. In the example of FIG. 9, the trench 116 is formed of three secondary trenches 116.1 to 116.3 on which and in which the portions of getter material 112 are deposited (here as in the first example described previously with reference to FIG. 5, that is to say by completely covering the secondary trenches and by covering part of the side walls of the secondary trenches). This subdivision of the trench 116 into several secondary trenches may take place over at least one part of the length of the trench 116.

Figure 10:
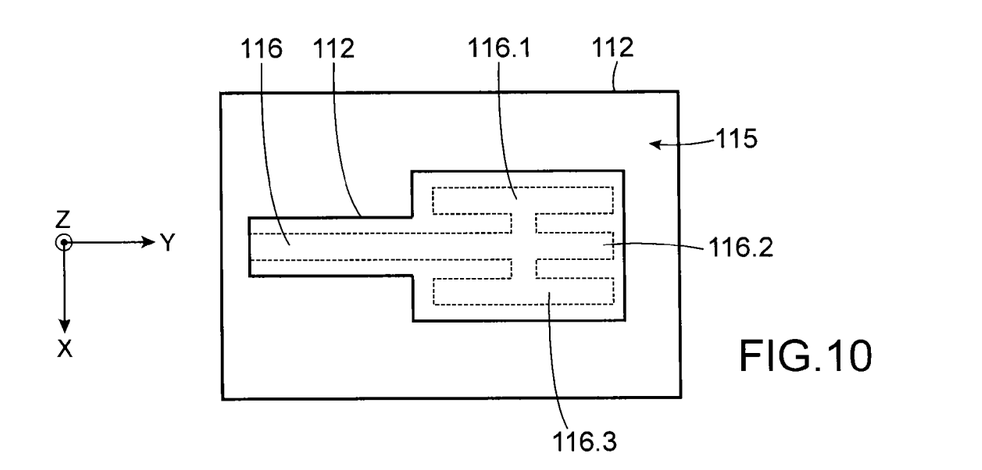

Such a configuration particularly has the advantage of further increasing the surface area of getter material exposed in the end in the cavity 108, while increasing the "reserve" of atmosphere, in terms of gas and/or pressure, which represents the interior volumes of the trenches 116. The secondary trenches may communicate together, for example by joining together at a part of the trench 116, as shown in FIG. 10 which corresponds to a partial top view of such a trench 116. In a variant, such secondary trenches may be formed over the whole length of one or more of the trenches 116, or over part only of the length of one or more of the trenches 116 as is the case in FIG. 10. It is also possible that the secondary trenches do not communicate with each other. In this case, each secondary trench comprises an independent access making it possible to make the interior of each of the secondary trenches communicate with the cavity 108. These accesses are advantageously formed at different times, for example as a function of the needs in terms of gaseous absorption/adsorption and/or reserve of atmosphere in the cavity 108. Such a formation of the trenches 116 may apply for example for a deposition of portions of getter material 112 similar to those described previously with reference to FIG. 5. It is also possible that one or more of the secondary trenches comprise a lower part wider than the rest of the secondary trench, as described previously with reference to FIG. 8.

Figure 11:
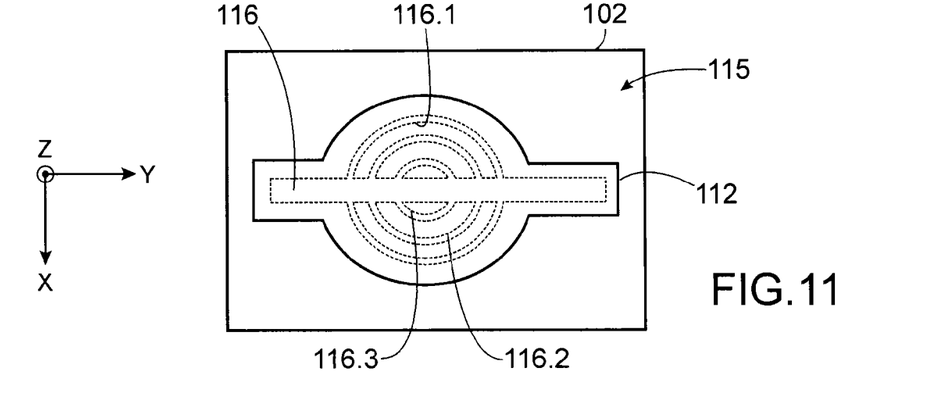

In the embodiment examples described previously, the trenches 116 and/or the secondary trenches are rectilinear. In a variant, the trenches 116 and/or the secondary trenches may not be rectilinear. FIG. 11 is a top view of an example of embodiment of a trench 116 of which part is connected to three secondary trenches 116.1, 116.2 and 116.3 each of substantially circular or elliptic shape. Such a formation of the trenches 116 may apply for depositions of portions of getter material 112 similar to those described previously with reference to FIGS. 5 to 7. It is also possible that one or more of these secondary trenches comprises a lower part wider than the rest of the secondary trench, as described previously with reference to FIG. 8.

Figure 12:
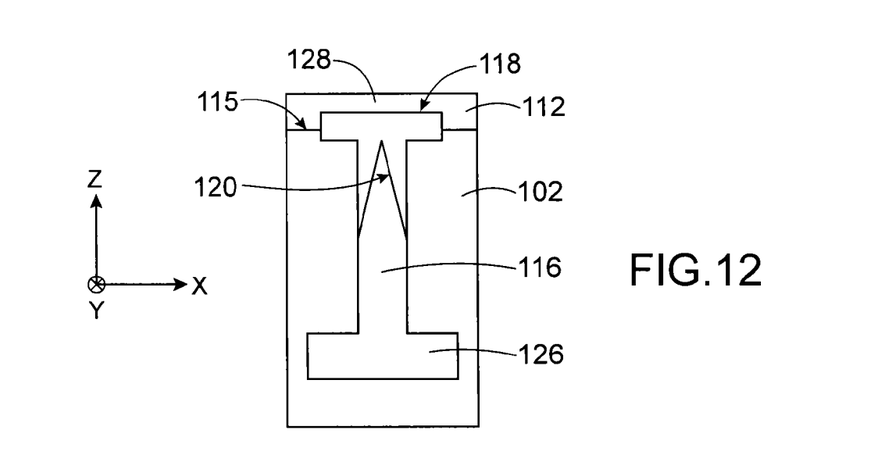

When the portions of getter material 112 are deposited on the face of the substrate around the trenches 116 (as is the case for all of the embodiment examples described previously), a levelling and/or an electrical insulation of the face 113 or 115 of the substrate on which the portions of getter material 112 are deposited may be carried out by covering the portions of getter material 112 and the rest of the face 113 or 115 of the substrate with a suitable passivation layer 128 to carry out such a levelling and/or such an electrical insulation, for example comprising SiN or $SiO_2$ deposited with a thickness greater than that of the portions of getter material 112, for example between around 1 µm and 10 µm (see FIG. 12). The material of the passivation layer 128 is chosen from materials that are the least favourable to degassing after deposition and during a rise in temperature of this material. Redistribution layers (RDL) forming several metal-insulator levels may moreover be formed above the face 113 or 115 on which is located the portions of getter material 112, or above the passivation layer 128. When the portions of getter material 112 are covered by another material, the gaseous pumping function is performed by the parts of the portions of getter material 112 located on the side walls of the trenches 116, from the faces 120 of the portions of getter material 112.

Figure 13:
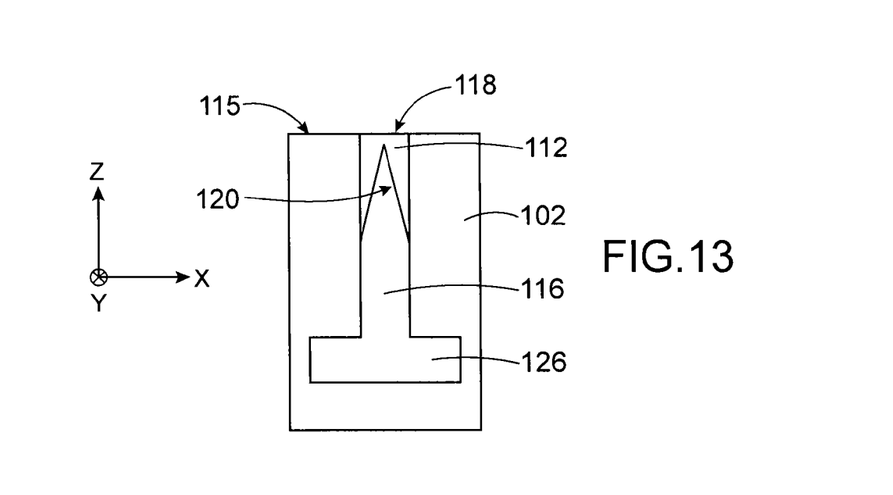

According to another variant, it is possible to carry out, after the deposition of the portions of getter material 112, a chemical mechanical planarization of the getter material with stop on the face 113 or 115 of the substrate. Such an embodiment variant is shown in FIG. 13. The flat surface thereby obtained may then serve for the implementation of other steps such as the formation of a passivation layer or distribution layers. Such a planarization may apply for depositions of portions of getter material 112 similar to those described previously with reference to FIGS. 6 and 7.

Figure 14:
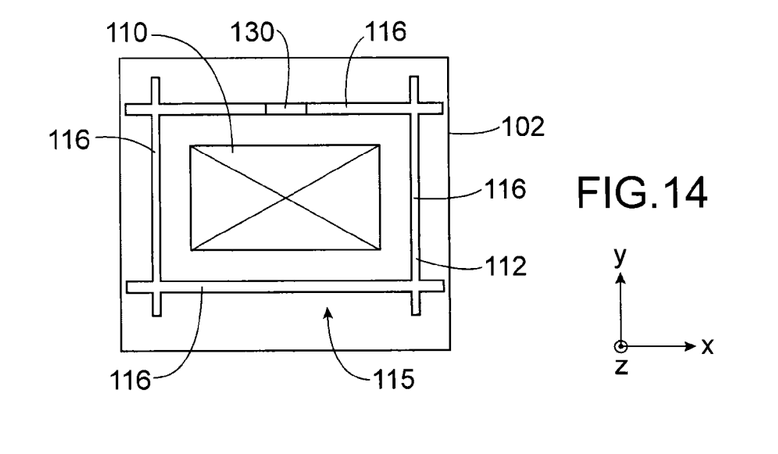

FIG. 14 shows a top view of part of the first substrate 102 of the encapsulation structure 100 described previously with reference to FIG. 2 or FIG. 3, and in which the portions of getter material 112 completely cover the trenches 116. In this figure, an opening 130 is formed through the portions of getter material 112 formed on one of the trenches 116, thereby making the atmosphere of the cavity 108 communicate with the interior volumes of the trenches 116, these interior volumes communicating together due to the fact that the trenches 116 intersect.

In a variant, the opening 130 could be formed through the face 115 of the first substrate 102. Such an opening could in particular be formed when the substrate comprising the trenches 116 is of SOI type, this opening being able to make the interior of the trenches 116 communicate with the atmosphere of the cavity 108 via an etching of part of the buried dielectric layer thereby making it possible to make the interior of one of the trenches 116 join up with the opening 130 formed through the substrate. Such a variant may be implemented by carrying out a selective etching of the buried dielectric material with respect to the getter material.

Figure 15:
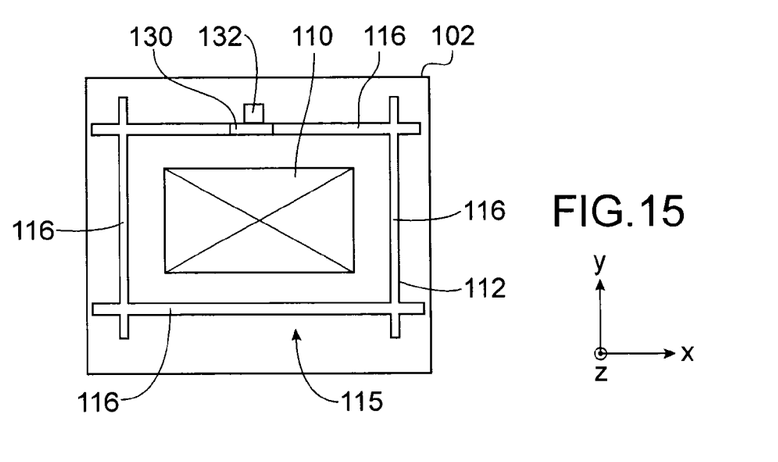

In the example shown in FIG. 15, a localised deposition of a plugging material 132, corresponding for example to a fusible material such as a metal or a metal alloy comprising for example indium and/or tin and/or AuSn and/or AuSi, is formed on the face 115 of the first substrate 102 close to the opening 130. Thus, after the encapsulation of the micro-device 110, it is possible to no longer expose the interior of the trenches 116 to the atmosphere of the cavity 108 by making this plugging material 132 melt which, through capillarity, is going to plug the opening 130. The amount of plugging material 132 deposited is chosen such that this material can form a plug of sufficient size to hermetically seal the opening 130.

Figure 16:
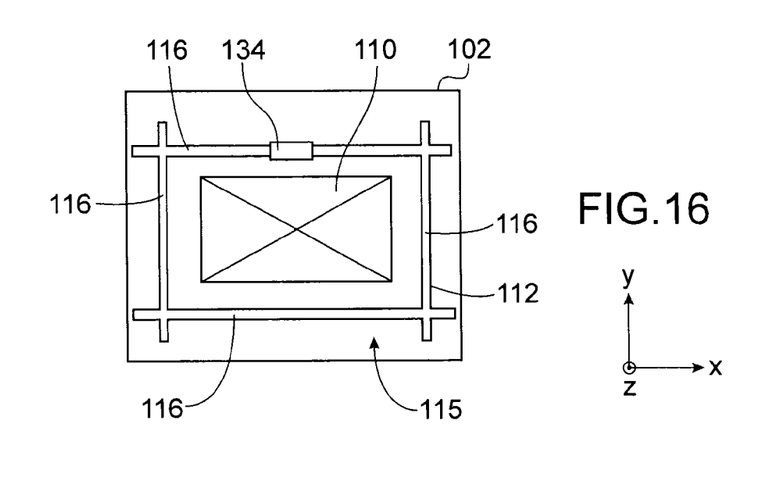

FIG. 16 shows another embodiment example in which the opening 130 is plugged by a plugging material 134, corresponding for example to a fusible material, before the hermetic encapsulation of the micro-device 110 in the cavity 108. This plugging material 134 is formed such that the surface area of the opening 130 is slightly less than the surface area of the plugging material 134 deposited. The thickness of the plugging material 134 is preferably minimised while remaining sufficient to assure hermetic sealing of the opening 130. After encapsulation, it is possible to make this plugging material 134 melt which then frees the opening 130 due to the fact that the plugging material 134 is then going to spread by wetting onto the getter material, thereby exposing the interior volumes of the trenches 116 to the atmosphere of the cavity 108. The nature of the plugging material 134 is chosen in particular as a function of the temperature at which the encapsulation is carried out, and corresponds for example to a eutectic alloy such as AuSi, AuSn, or AlGe.

Thus, the surfaces 120 of the portions of getter material 112 located in the trenches 116 are protected from the ambient atmosphere throughout the implementation of the method of encapsulation. Furthermore, if the deposition of the plugging material 134 is carried out under vacuum or under a particular gaseous atmosphere, the interior volumes of the trenches 116 then form reserves of vacuum or of this particular atmosphere being able to be freed at any time after the encapsulation of the micro-device 110 in the cavity 108, the amount of these reserves being able to be adjusted as a function of the dimensions, and in particular of the depth, of the trenches 116.

After hermetic sealing of the cavity 108, the portions of getter material 112 are thermally activated by exposing the encapsulation structure 100 to a temperature that triggers a gaseous absorption and/or adsorption of the getter material. This thermal activation temperature of the getter material depends in particular on the nature of the getter material.

In all of the embodiments and examples described previously, it is possible to form, between the portions of getter material 112 and the material of the substrate on which the portions 112 are formed, a sub-layer of material making it possible to adjust the thermal activation temperature of the getter material. Such an adjustment sub-layer corresponds for example to a layer of chromium and/or platinum and/or aluminium, of thickness between around 10 nm and 100 nm. The presence of such an adjustment sub-layer under the portions of getter material 112 makes it possible to modify the temperature at which the getter material of the portions 112 is thermally activated, and advantageously makes it possible to lower this thermal activation temperature. An adhesion sub-layer comprising titanium and/or chromium and/or zirconium, of which the thickness is for example between around 10 nm and 100 nm, may be formed under the adjustment sub-layer in order to improve adhesion between the material of the first substrate 102 or the second substrate 104 and the material of the adjustment sub-layer. Details of an embodiment of such sub-layer for adjusting the thermal activation temperature of the getter material, and of such an adhesion sub-layer are described in the document FR 2 922 202.

In all of the embodiments and examples described previously, it is possible to cover and temporarily protect the portions of getter material 112 by a protective layer such as a layer of chromium of thickness between around several nanometers and 100 nm, or by a layer of nitride or oxide obtained by dry process, as described in the document FR 2 950 876. This protective layer may be eliminated when the getter material is thermally activated.

A method of encapsulation of the micro-device 110, forming the encapsulation structure 100 will now be described.

The trenches 116 are firstly formed through the face 115 of the first substrate 102 and/or through the face 113 of the second substrate 104, these substrates comprising for example silicon. These trenches 116 are for example formed via the implementation of steps of photolithography and etching of DRIE (deep reactive ion etching) type. A hard $SiO_2$ mask, for example of thickness between around 100 nm and 10 μm, makes it possible for example to etch the trenches 116 of which the aspect ratio (depth/width) is equal to around 30.

Portions of getter material 112 are then formed on part of the side flanks of the trenches 116 and by completely or partially covering the trenches 116 at the face 113 and/or 115 of the substrate in which the trenches 116 are formed. The getter material is for example zirconium and/or titanium deposited over a thickness between around 100 nm and 2 μm. The potential adhesion and adjustment sub-layers are formed prior to the formation of the portions of getter material 112. It is also possible to deposit a thick adjustment sub-layer, that is to say of thickness greater than around 100 nm, so as to increase the aspect ratio, or form factor, of the trench and thus favour sealing of the trench by the deposition of the getter.

Such a case can apply to the configuration described previously with reference to FIG. 5, with in this case the implementation of two depositions: one for the adjustment sub-layer and the other for the getter material.

These portions of getter material 112 may be formed by lift-off, that is to say by deposition through a mask of resin formed beforehand by photolithography and etching on the face 115 of the first substrate 102 and/or the face 113 of the second substrate 104. To form the resin mask, a dry film of photosensitive resin of thickness between around 1 and 10 μm is advantageously used, this thickness even being able to be less than around 1 μm in order to obtain the best possible resolution for the photolithography implemented. When the width of the trenches 116 is low and close to around 1 μm, a standard resin may be used to form the mask. After the deposition of the getter material, the mask of resin as well as the getter material located on the mask of resin are removed.

In a variant, the portions of getter material 112 may be formed by a deposition of the getter material on the whole of the face 115 of the first substrate 102 and/or the face 113 of the second substrate 104, then steps of photolithography and etching of the getter material deposited to form the portions 112. Depending on the nature of the getter material, the etching may be carried out by wet process or by dry process such as RIE (reactive ion etching).

When the portions of getter material 112 are intended to be covered with a passivation layer such as the layer 128 described previously, this passivation layer 128 is formed for example via a deposition by evaporation of $SiO_2$, this deposition being able to be carried out in the same unit as that having served for the deposition of the portions of getter material 112. It is thereby possible to create a vacuum reserve because the deposition by evaporation may be carried out at a pressure of the order of $10^{-6}$ mbar. Conversely, a deposition of oxide by cathodic sputtering under a partial pressure of a carrier gas such as argon or krypton makes it possible to create a reserve of gas.

When an opening 130 has been formed, it is then possible to carry out localised deposition of the plugging material 132 close to the opening 130. When the plugging material 132 comprises gold, this deposition corresponds for example to a PVD (physical vapour deposition) carried out on the face of the substrate. When the plugging material 132 comprises indium or tin, this deposition corresponds for example to a PVD carried out in part on the face of the substrate and on the getter material or on the adjustment sub-layer or on the adhesion sub-layer. In a variant, the opening 130 may be directly plugged by the plugging material 134.

The micro-device 110 may be formed on the first substrate 102 before or after implementation of the different steps above. When the portions of getter material 112 are intended to be arranged next to the micro-device 110, the portions of getter material 112 are preferably formed before the formation of the micro-device 110 and protected in particular by not making the interior of the trenches 116 communicate with the ambient atmosphere, for example by plugging beforehand an opening with a plugging material as described previously with reference to FIG. 16, and potentially while protecting the surfaces 118 of portions of getter material 112 by a protective layer as described previously.

Although the method of encapsulation described previously is carried out for the encapsulation of a single micro-device 110, this method is advantageously implemented to carry out a collective encapsulation of several micro-devices in different cavities arranged next to each other on a same substrate.

The invention claimed is:

1. An encapsulation structure comprising at least:
   a hermetically sealed cavity in which a micro-device is encapsulated,
   a substrate of which one face delimits one side of the cavity,
   at least two trenches formed through said face of the substrate, the interior volumes of each of the trenches communicating together,
   first portions of getter material covering at least in part side walls of the trenches without entirely filling the trenches, and completely covering the trenches at said face of the substrate,
   an opening formed through one of the first portions of getter material or through the substrate and making the interior volumes of the trenches communicate with an interior volume of the cavity.

2. The encapsulation structure according to claim 1, in which the trenches are formed in the substrate according to a grid pattern such that each of the trenches intersects at least one other trench.

3. The encapsulation structure according to claim 1, further comprising one or more second portions of getter material arranged at one or more bottom walls of the trenches.

4. The encapsulation structure according to claim 1, in which the opening is plugged with a plugging material.

5. The encapsulation structure according to claim 1, in which the first portions of getter material cover the parts of said face of the substrate located around the trenches.

6. The encapsulation structure according to claim 1, in which the first portions of getter material comprise columnar grains oriented along a direction forming a non-zero angle and less than 90° with the side walls of the trenches.

7. The encapsulation structure according to claim 1, in which the dimensions of at least one of the trenches, at said face of the substrate, are less than the dimensions of said at least one of the trenches at a bottom wall of said at least one of the trenches.

8. The encapsulation structure according to claim 1, in which at least one part of at least one of the trenches comprises several secondary trenches formed through said face of the substrate, arranged next to each other and in which the interior volumes communicate together, the first portions of getter material covering at least in part side walls of the secondary trenches.

9. The encapsulation structure according to claim 1, in which the first portions of getter material are formed by at least one first layer of a first getter material and at least one second layer of a second getter material.

10. The encapsulation structure according to claim 9, in which the second getter material is different from the first getter material.

11. The encapsulation structure according to claim 9, in which the first layer of the first getter material completely covers the trenches at said face of the substrate, and in which the second layer of the second getter material covers the first layer of the first getter material.

12. The encapsulation structure according to claim 9, in which the first layer of the first getter material partially covers the trenches at said face of the substrate, and in which the second layer of the second getter material covers the first layer of the first getter material and completely seals the trenches at said face of the substrate.

13. A method of encapsulating at least one micro-device, comprising at least the implementation of the steps of:
   forming at least two trenches through one face of a substrate such that the interior volumes of each of the trenches communicate together;
   forming first portions of getter material covering at least in part side walls of the trenches without entirely filling the trenches, and completely covering the trenches at said face of the substrate;
   forming at least one opening through one of the first portions of getter material or through the substrate and making the interior volumes of the trenches communicate with an interior volume of a cavity in which the micro-device is arranged and such that said face of the substrate delimits one side of the cavity;
   hermetic sealing of the cavity.

* * * * *